US012777902B2

(12) United States Patent
Wu et al.

(10) Patent No.: US 12,777,902 B2
(45) Date of Patent: Oct. 27, 2026

(54) GRADIENT OXIDATION AND ETCH OF PVD MOLYBDENUM FOR BOTTOM UP GAP FILL

(71) Applicant: Applied Materials, Inc., Santa Clara, CA (US)

(72) Inventors: Meng-Shan Wu, Santa Clara, CA (US); Chih-Hsun Hsu, Santa Clara, CA (US); Jiang Lu, Milpitas, CA (US); Shiyu Yue, Santa Clara, CA (US); Chun-chieh Wang, Santa Clara, CA (US); Annamalai Lakshmanan, Fremont, CA (US); Yixiong Yang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 670 days.

(21) Appl. No.: 18/128,389

(22) Filed: Mar. 30, 2023

(65) Prior Publication Data

US 2023/0343645 A1 Oct. 26, 2023

Related U.S. Application Data

(60) Provisional application No. 63/334,428, filed on Apr. 25, 2022.

(51) Int. Cl.

| | |
|---|---|
| ***H10W 20/00*** | (2026.01) |
| ***H10P 72/00*** | (2026.01) |
| ***H10W 20/41*** | (2026.01) |

(52) U.S. Cl.

CPC ....... *H10W 20/054* (2026.01); *H10P 72/0418* (2026.01); *H10P 72/0462* (2026.01);

(Continued)

(58) Field of Classification Search

CPC ............ H10W 20/054; H10W 20/033; H10W 20/045; H10W 20/048; H10W 20/057;

(Continued)

(56) References Cited

U.S. PATENT DOCUMENTS 6,228,754 B1 * 5/2001 Iacoponi ........... H01L 21/76871 438/618

8,722,510 B2 5/2014 Watanabe et al.

(Continued)

FOREIGN PATENT DOCUMENTS

KR 20200085935 A 7/2020

WO 2020185618 A1 9/2020

(Continued)

OTHER PUBLICATIONS

International Search Report and Written Opinion for Application No. PCT/US2023/015613 dated Jul. 4, 2023.

(Continued)

*Primary Examiner* — Julia Slutsker

(74) *Attorney, Agent, or Firm* — Patterson + Sheridan, LLP

(57) ABSTRACT

A method and apparatus for a gap-fill in semiconductor devices are provided. The method includes forming a metal seed layer on exposed top surface of the substrate, wherein the substrate has features in the form of trenches or vias formed in the top surface of the substrate, the features having sidewalls and a bottom surface extending between the sidewalls. A gradient oxidation process is performed to oxidize exposed portions of the metal seed layer to form a metal oxide, wherein the gradient oxidation process preferentially oxidizes a field region of the substrate over the bottom surface of the features. An etch back process removes the oxidized portion of the seed layer. A second etch process removes portions of the seed layer. A metal (Continued)

gap-fill process fills or partially fills the features with a gap fill material.

13 Claims, 3 Drawing Sheets

(52) U.S. Cl.
CPC ....... *H10W 20/033* (2026.01); *H10W 20/045* (2026.01); *H10W 20/048* (2026.01); *H10W 20/057* (2026.01); *H10W 20/425* (2026.01)

(58) Field of Classification Search
CPC .............. H10W 20/425; H10P 72/0418; H10P 72/0462; H10P 14/44
See application file for complete search history.

(56) References Cited

U.S. PATENT DOCUMENTS

| | | | |
|---|---|---|---|
| 9,865,501 | B2 | 1/2018 | Spurlin et al. |
| 2005/0212139 | A1 | 9/2005 | Leinikka et al. |
| 2018/0323103 | A1* | 11/2018 | Shaviv .............. H01L 21/67207 |
| 2019/0035640 | A1 | 1/2019 | Thorkelsson et al. |
| 2019/0067014 | A1 | 2/2019 | Shrestha et al. |
| 2019/0393156 | A1* | 12/2019 | Zierath .................. C22C 19/00 |
| 2020/0095674 | A1 | 3/2020 | Saly et al. |
| 2021/0305059 | A1 | 9/2021 | Lai et al. |
| 2021/0320034 | A1 | 10/2021 | Lei et al. |

FOREIGN PATENT DOCUMENTS

| | | | |
|---|---|---|---|
| WO | 2021035254 | A1 | 2/2021 |
| WO | 2021178399 | A1 | 9/2021 |
| WO | 2021237032 | A1 | 11/2021 |

OTHER PUBLICATIONS

International Search Report and Written Opinion for Application No. PCT/US2023/016970 dated Jul. 24, 2023.

Korean Office Action for Application No. 10-2024-7038751 dated Jul. 11, 2025.

Office Action from Taiwanese Patent Application No. 112114057, dated May 29, 2026.

* cited by examiner

GRADIENT OXIDATION AND ETCH OF PVD MOLYBDENUM FOR BOTTOM UP GAP FILL

CROSS-REFERENCE TO RELATED APPLICATIONS

This application claims benefit of U.S. Provisional Application Ser. No. 63/334,428, filed Apr. 26, 2022, of which is incorporated by reference in its entirety.

TECHNICAL FIELD

Embodiments of the invention relate to a method and apparatus of forming thin films. More particularly, the disclosures relate to a method and apparatus for metal gap fill in semiconductor devices.

BACKGROUND

The fabrication of microelectronic devices typically involves a complicated process sequence requiring hundreds of individual processes performed on semi-conductive, dielectric and conductive substrates. Examples of these processes include oxidation, diffusion, ion implantation, thin film deposition, cleaning, etching, lithography among other operations. Each operation is time consuming and expensive.

With ever-decreasing critical dimensions for microelectronic devices, the design and fabrication for these devices on substrates is becoming or has become increasingly complex. Control of the critical dimensions and process uniformity becomes increasingly more significant. Complex multilayer stacks used to make microelectronic devices involve precise process monitoring of the critical dimensions for the thickness, roughness, stress, density, and potential defects. Process recipes for forming the devices have multiple incremental processes to ensure critical dimensions are maintained. Typically, each incremental process may utilize one or more processing chambers that adds additional time for forming the devices and also increases opportunities for forming defects. Thus, each process adds to the overall fabrication cost and risk for defects in completed microelectronic device.

Additionally, as critical dimensions on these devices shrink, past fabrication techniques encounter new hurdles. For example, as a liner and/or seed layer is prepared to grow a metal gap-fill, the liner and/or seed layer may be still be present on the sides of the gap, potentially causing the fill material to close off the gap prior to completely filling at the bottom. Conventional methods for removing the seed layer from the sides of the gap and the top surface may additionally result in the removal of the seed layer at the bottom of the gap intended for seeding the fill material.

For at least the foregoing reasons, there is an ongoing need for improved gap fill fabrication methods.

SUMMARY

The present disclosure relates to a method and apparatus for forming thin-films. More particularly, the disclosure relates to a method and apparatus for filling a feature on a substrate.

In one example, a method of filling a feature on a substrate is provided. The method includes forming a metal seed layer on exposed top surface of the substrate, wherein the substrate has features in the form of trenches or vias formed in the top surface of the substrate, the features having sidewalls and a bottom surface extending between the sidewalls. A gradient oxidation process is performed to oxidize exposed portions of the metal seed layer to form a metal oxide, wherein the gradient oxidation process preferentially oxidizes a field region of the substrate over the bottom surface of the features. An etch back process removes the oxidized portion of the seed layer. A second etch process removes other portions of the seed layer. A metal gap-fill process fills or partially fills the features with a gap fill material.

In another example, another method of filling a feature on a substrate is provided. The method includes depositing a molybdenum-containing layer over an exposed surface of a substrate, wherein the substrate comprises a plurality of features formed in a top surface of the substrate, each of the plurality of features having a sidewall surface and a bottom surface, and the deposited molybdenum-containing layer is formed over the top surface of the substrate, and the sidewall surface and bottom surface of the plurality of features. The exposed surface of the substrate is exposed to a gradient oxidizing process, wherein the gradient oxidizing process forms oxidized regions of the molybdenum-containing layer. The oxidized regions are preferentially etched, wherein after preferentially etching the oxidized regions, a first portion of the deposited molybdenum-containing layer remains on the bottom surface in each of the plurality of features. An isotropic etch process removes portions of the molybdenum-containing layer. The features are filled with a second molybdenum layer, wherein filling the features with the second molybdenum layer comprises growing the second molybdenum layer from the second portion of the deposited molybdenum-containing layer on the sidewall surface and the first portion of the deposited molybdenum-containing layer on the bottom surface in each of the features.

In yet another example, a cluster tool for filling a feature on a substrate is provided. The cluster tool includes an oxygen source that is fluidly coupled to a processing region of a first process chamber, wherein the oxygen source is configured to deliver an oxygen-containing gas to the processing region. The cluster tool has a first flow control valve that is configured to control the flow of oxygen-containing gas provided from the oxygen source to the processing region, and a first inductively coupled plasma source that is configured to generate a plasma in the processing region, wherein the plasma comprises the oxygen-containing gas, and a controller. The cluster tool includes a second process chamber having a first etching gas source that is fluidly coupled to a processing region of the second process chamber, a second flow control valve that is configured to control a flow of first etching gas provided from the first etching gas source to the processing region, and a second etching gas source that is fluidly coupled to the processing region of the second process chamber, wherein the second etching gas source is configured to deliver a second etching gas to the processing region, wherein a third flow control valve is configured to control the flow of the second etching gas provided from the second etching gas source to the processing region. The controller is configured to form a metal seed layer on exposed top surface of a substrate, wherein the substrate has features in the form of trenches or vias formed in the top surface of the substrate, the features having sidewalls and a bottom surface extending between the sidewalls. The controller is further configured to perform a gradient oxidation process to oxidize exposed portions of the metal seed layer to form a metal oxide, wherein the gradient oxidation process preferentially oxidizes a field region of the substrate over the bottom surface of the features. The controller performs an etch back process to remove the oxidized portion of the seed layer. The controller performs a second etch process to remove portions of the seed layer and performs a molybdenum gap-fill process to fill or partially fill the features with a gap fill material.

BRIEF DESCRIPTION OF THE DRAWINGS

So that the manner in which the above-recited features of the present disclosure can be understood in detail, a more particular description of the aspects, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
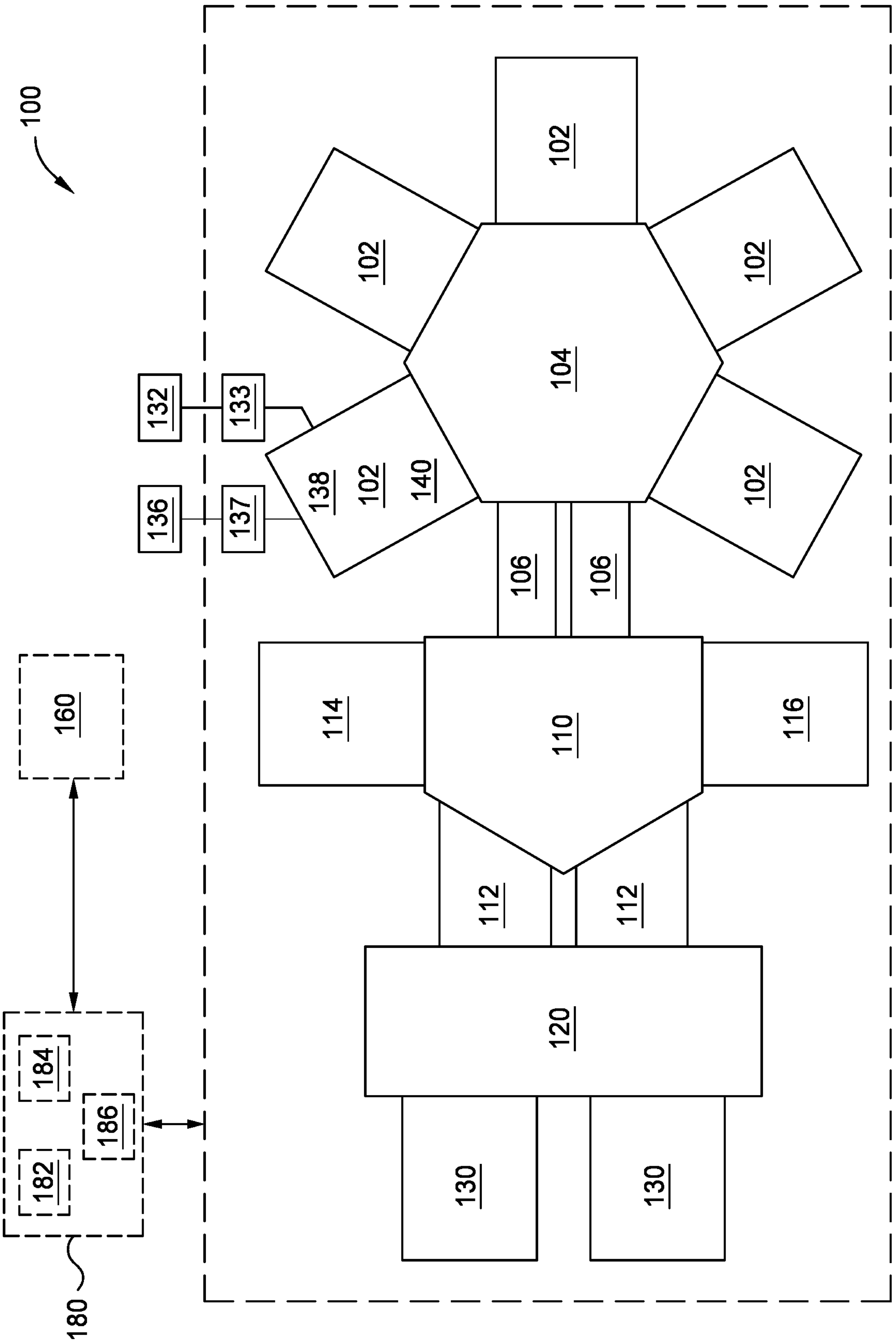
FIG. 1 illustrates a schematic top view of one example of a multi-chamber processing tool in accordance with one or more embodiments of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

In the summary above, the detailed description, the claims below, and in the accompanying drawings, reference is made to particular features (including method operations) of the present disclosure. It is to be understood that the disclosure in this specification includes all possible combinations of such particular features. For example, where a particular feature is disclosed in the context of a particular aspect or implementation of the present disclosure, or a particular claim, that feature can also be used, to the extent possible in combination with and/or in the context of other particular aspects and implementations of the present disclosure, and in the present disclosure generally.

The term "comprises" and grammatical equivalents thereof are used herein to mean that other components, ingredients, operations, etc. are optionally present. For example, an article "comprising" (or "which comprises") components A, B, and C can consist of (i.e., contain only) components A, B, and C, or can contain not only components A, B, and C but also one or more other components.

Where reference is made herein to a method comprising two or more defined operations, the defined operations can be carried out in any order or simultaneously (except where the context excludes that possibility), and the method can include one or more other operations which are carried out before any of the defined operations, between two of the defined operations, or after all of the defined operations (except where the context excludes that possibility).

Embodiments of the present disclosure relate to a method and apparatus for filling a feature on a substrate. For example, the method may perform a high selectivity gradient oxidation and etch for physical vapor deposition (PVD) metal as a bottom seed layer in a bottom up gap fill. The metal gap fill process may be used to deposit different metals, such as tungsten (W), molybdenum (Mo), ruthenium (Ru), and other metals. The disclosure contains separate process sequences that include a metal oxidation (e.g. $WO_x$, $MoO_x$) process and a selective removal process for the metal oxide.

PVD metal deposition typically leads to a thicker film on the field surrounding a via (or trench) and a thinner film at the bottom of the via. The oxidation and etch gradient process selectively removes the field metal. The metal disposed in the field surrounding the via is 'selectively' oxidized at a rate up to seven times faster than the metal disposed at the bottom of the via. The selective oxidation permits a subsequent etch process to remove the field metal oxides while leaving a small bottom metal layer as a seed for a metal fill. A very high selectivity for the etch removal of the oxidized metal in the field relative to the bottom (non-oxidized) metal results in a thin metal seed layer remaining at the bottom of the via. The oxidation process uses an inductively coupled (ICP) oxygen ($O_2$) plasma having a low power, low $O_2$ flow, and high temperature reaction that produces a high ion ratio at low ion energy which enhances the selectivity that preferentially oxidizes the metal in the field over the metal at the bottom of the via. Using this approach, the field metal can be completely removed while leaving a good quality metal seed layer at the bottom of the structure for a seam-free bottom up gap fill.

Examples of a processing system that may be suitably modified in accordance with the teachings provided herein include an integrated processing system or other suitable processing systems commercially available from Applied Materials, Inc., located in Santa Clara, California. It is contemplated that other processing systems (including those from other manufacturers) may be adapted to benefit from aspects described herein.

FIG. 1 illustrates a schematic top-view diagram of an example multi-chamber processing system 100, or cluster tool, which can be used to complete a gradient oxidation and etch of a PVD metal according to implementations of the present disclosure. The processing system 100 includes a plurality of process chambers 102 coupled to a first transfer chamber 104. The first transfer chamber 104 is also coupled to a first pair of pass-through chambers 106. The first transfer chamber 104 has a centrally disposed transfer robot (not shown) for transferring substrates between the pass-through chambers 106 and the process chambers 102. The pass-through chambers 106 are coupled to a second transfer chamber 110, which is coupled to a process chamber 114 that is configured to perform pre-clean process and a process chamber 116 that is configured to perform a PVD deposition process, or alternatively, an epitaxial growth process or atomic deposition chamber. The second transfer chamber 110 has a centrally disposed transfer robot (not shown) for transferring substrates between a set of load lock chambers 112 and the process chamber 114 or the process chamber 116. A factory interface 120 is connected to the second transfer chamber 110 by the load lock chambers 112. The factory interface 120 is coupled to one or more pods 130 on the opposite side of the load lock chambers 112. The pods 130 may be front opening unified pods (FOUP) or similar devices for storing and transporting substrates.

Prior to various operations, a substrate may first be transferred from one of the pods 130 to the process chamber 114 where a pre-clean process is performed to remove contaminants, such as carbon or oxide contaminants from an exposed surface of a source/drain region of a transistor to be formed on the substrate.

The substrate is then transferred to one or more of the process chambers 102. In some implementations, the process chamber 102 may etch a via or a trench in a dielectric material layer of the substrate. In some implementations, the substrate is provided to an etch chamber, which is not a part of the processing system 100, to perform the trench formation process. In other operations, the substrate is provided with trenches formed therein. Once the trench is formed in the dielectric material, the substrate is transferred to the process chamber 114 for cleaning.

Then the substrate is transferred to the process chamber 116 and/or at least one of the process chambers 102 where one or more operations are performed. For example, the substrate is transferred to one of the process chambers 102 where a metal deposition operation is performed to form a seed layer. The metal can be deposited in any suitable chamber such as a PVD chamber, atomic layer deposition (ALD) chamber, epitaxial (EPI) chamber or other suitable chamber.

After deposition of the seed layer, the substrate may be transferred to one of the process chambers 102 where a gradient oxidation operation may be performed. The gradient oxidation may be performed in an inductively coupled plasma (ICP) reactor or other suitable plasma-processing chamber. The gradient oxidation operation is configured to oxidize unwanted portions of the metal layer formed on the substrate. For example, the metal formed in a bottom and a sidewall of a trench or via may be oxidized along with the metal disposed in on a field region, i.e., top side, of the substrate.

The substrate is transferred to one of the process chambers 102 where an etch operation is performed to selectively remove the oxidized portions of the deposited metal layer. For example, the etch operation may be performed in an etch chamber. Alternately, the etch operation may be performed in the ICP reactor in which the gradient oxidation was performed.

After the etch operation, a portion of the deposited metal layer (e.g., seed material) will remain thicker along the bottom surfaces of the via or trench and thinner in the field area. In some embodiments, the seed material may additionally be present along the sidewall of the feature. An isotropic etch process can be performed to target the seed layer. The isotropic etch process may be performed in the same or a second processing chamber to remove portions of the seed material. The isotropic etch process removed the seed material in the field area while thinning the thicker seed material along the bottom surface of the via or trench. The isotropic etch process results in only seed material remaining primarily in the via in preparation of a gap-fill operation.

The substrate can then be transferred to one of the process chambers 102 or 116 where the gap-fill operation is performed. The gap-fill operation may be performed in a CVD chamber, ALD chamber or other suitable chamber. For example, process chamber 102 or 116 may deposit a metal such as tungsten (W), molybdenum (Mo), ruthenium (Ru) or other suitable material that grows on the seed layer disposed on the bottom of the trench or feature for forming a portion of a microelectronic device.

A system controller 180 is coupled to the processing system 100 for controlling the processing system 100 or components thereof. For example, the system controller 180 may control the operations of the processing system 100 using a direct control of the chambers 102, 104, 106, 110, 112, 114, 116, 120, 130 of the processing system 100 or by controlling controllers associated with the chambers 102, 104, 106, 110, 112, 114, 116, 120, 130. In operation, the system controller 180 enables data collection and feedback from the respective chambers to coordinate performance of the processing system 100.

The system controller 180 generally includes a central processing unit (CPU) 182, memory 184, and support circuits 186. The CPU 182 may be one of any form of a general-purpose processor that can be used in an industrial setting. The memory 184, non-transitory computer-readable medium, or machine-readable storage device, is accessible by the CPU 182 and may be one or more of memory such as random access memory (RAM), read only memory (ROM), floppy disk, hard disk, or any other form of digital storage, local or remote. The support circuits 186 are coupled to the CPU 182 and may comprise cache, clock circuits, input/output subsystems, power supplies, and the like. The various implementations disclosed in this disclosure may generally be implemented under the control of the CPU 182 by executing computer instruction code stored in the memory 184 (or in memory of a particular process chamber) as, e.g., a computer program product or software routine. That is, the computer program product is tangibly embodied on the memory 184 (or non-transitory computer-readable medium or machine-readable storage device). When the CPU 182 executes the computer instruction code, the CPU 182 controls the chambers to perform operations in accordance with the various implementations.

The system controller 180 is configured to perform methods such as a method 300 (described further below) stored in the memory 184.

In some embodiments, the first process chamber 102 includes an oxygen source 132 that is fluidly coupled to a processing region 140 of the first process chamber 102, wherein the oxygen source 132 is configured to deliver an oxygen-containing gas to the processing region 140. The first process chamber 102 may further include a first flow control valve 133 that is configured to control the flow of oxygen-containing gas provided from the oxygen source 132 to the processing region 140. The first process chamber 102 may further include an etching gas source 136 that is fluidly coupled to the processing region 140 of the first process chamber 102, wherein the etching gas source 136 is configured to deliver an etching gas to the processing region 140. The first process chamber 102 may further include a second flow control valve 137 that is configured to control the flow of the etching gas provided from the etching gas source 136 to the processing region 140. The first process chamber 102 may further include an inductively coupled plasma source 138 that is configured to generate a plasma in the processing region 140, wherein the plasma comprises the hydrogen-containing gas and the oxygen-containing gas.

In some embodiments, the system controller 180 is configured to control the first flow control valve 133 so that an amount of oxygen-containing gas is provided to a surface of a substrate, disposed in the processing region 140 of the first processing chamber 102. The oxygen-containing gas preferentially oxidizes one or more metal-containing layers disposed on a field region and sidewalls of features formed in the substrate. The system controller 180 is additionally configured to control the second flow control valve 137 so that an amount of etching gas provided to the surface of the substrate preferentially etches the oxidized portions of the one or more metal-containing layers disposed on the field region and sidewalls of the features formed in the substrate. After the oxidized portions of the one or more metal-containing layers are etched, the system controller 180 may optionally control another or the same flow control valve in the same process chamber so that an amount of a second etching gas provided to the surface of the substrate preferentially etches the one or more metal-containing layers disposed on the field region and the features formed in the substrate.

Alternately, after the oxidized portions of the one or more metal-containing layers are etched, the substrate may be moved to a second process chamber in the cluster tool. The second process chamber having a first etching gas source that is fluidly coupled to a processing region of the second process chamber, a second flow control valve that is configured to control a flow of first etching gas provided from the first etching gas source to the processing region, and a second etching gas source that is fluidly coupled to the processing region of the second process chamber, wherein the second etching gas source is configured to deliver a second etching gas to the processing region, wherein a third flow control valve is configured to control the flow of the second etching gas provided from the second etching gas source to the processing region. The system controller 180 is additionally configured to control the third flow control valve so that an amount of etching gas provided to the surface of the substrate preferentially etches the one or more metal-containing layers disposed on the field region and the features formed in the substrate.

FIGS. 2A-2F and FIG. 3 will be discussed together. FIGS. 2A-2F illustrate cross-sectional views of some embodiments of a device structure for semiconductor devices at various stages of manufacture provided to illustrate the method 300 of FIG. 3. The method 300 can be used to fill various features, for example, trenches or vias with a gap-fill metal. Although FIGS. 2A-2F are described in relation to the method 300, it will be appreciated that the structure disclosed in FIGS. 2A-2F are not limited to the method 300, but instead may stand alone as structures independent of method 300. Similarly, although the method 300 is described in relation to FIGS. 2A-2F, it will be appreciated that the method 300 is not limited to the structures disclosed in FIGS. 2A-2F, but instead may stand alone independent of the structures disclosed in FIGS. 2A-2F.

For the sake of clarity, some item numbers in later figures illustrating the subsequent stages have been omitted. The item numbers can be gleaned from the earlier figures when the discussion calls out those shown features in the later figures. For example, item numbers in FIG. 2B may be omitted from certain features disclosed in FIG. 2A.

Figures 2A, 2B, 2C, 2D, 2E, 2F:
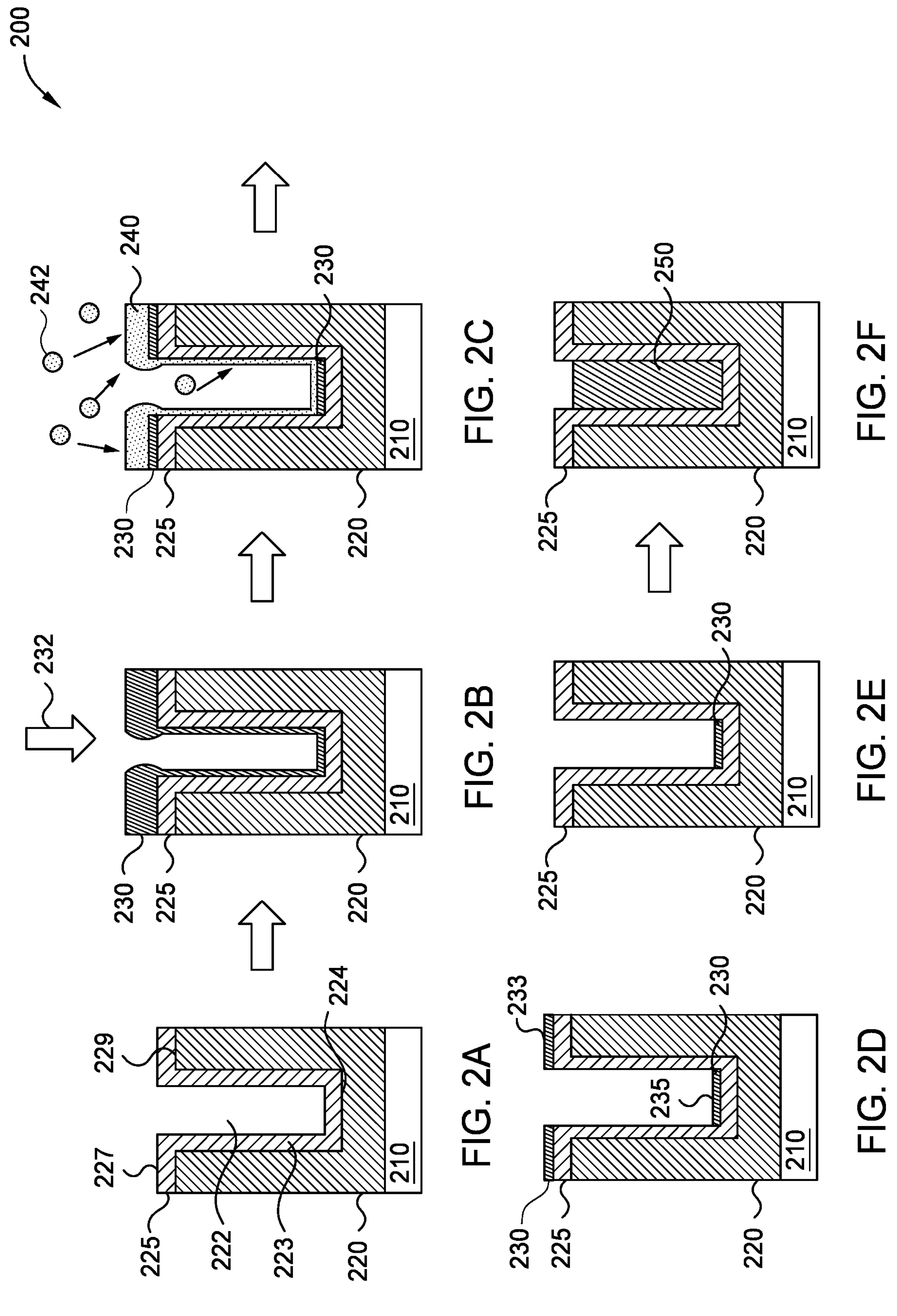
FIGS. 2A-2F illustrate views of a semiconductor device during different stages of fabrication in accordance with one or more embodiments of the present disclosure.
Figure 3:
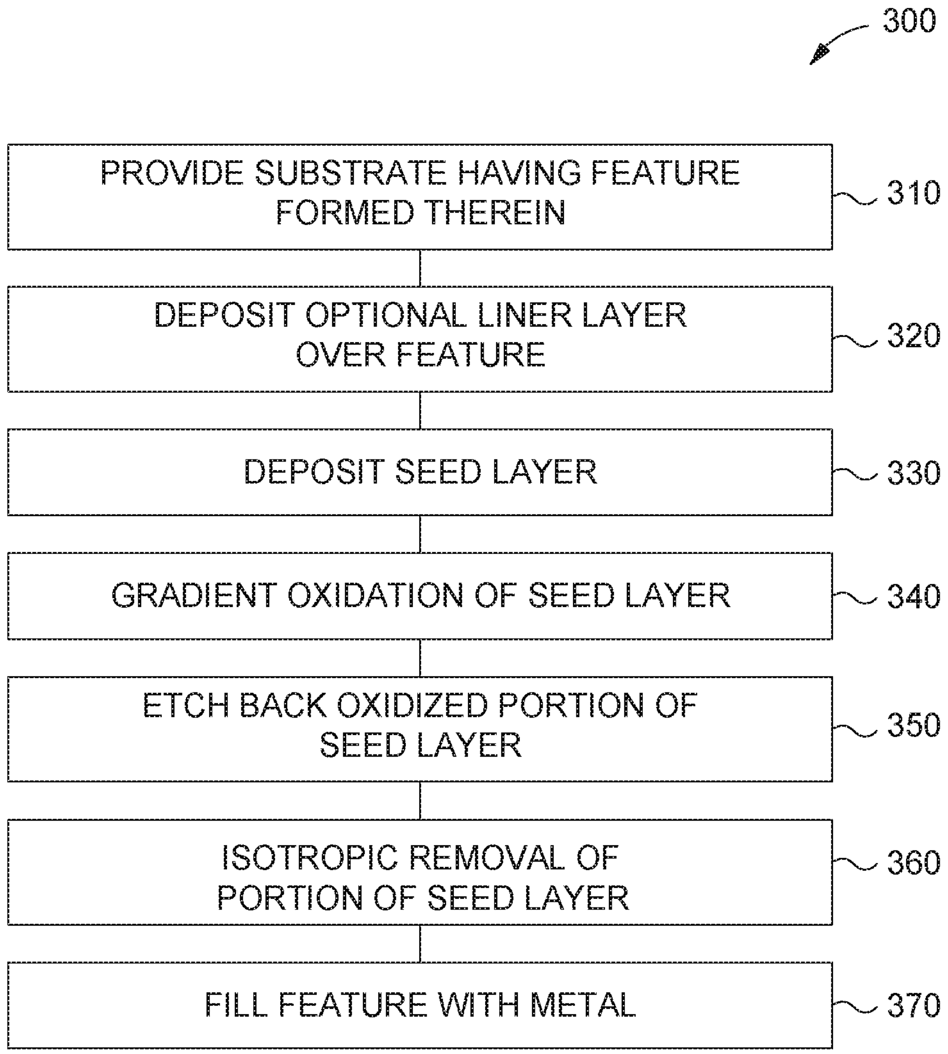
FIG. 3 illustrates a flow diagram of a method for filling a feature on a substrate in accordance with one or more embodiments of the present disclosure.

The method 300 begins at operation 310 where, a substrate is provided having trenches or vias formed in a top surface. The substrate may be a device substrate or a semiconductor substrate described herein. FIG. 2A illustrates a cross-sectional view of a semiconductor device structure 200 during intermediate stages of manufacturing corresponding to operation 310, in accordance with some embodiments. The semiconductor device structure 200 includes a body 210 having a dielectric layer 220 formed thereon.

The body 210 of the semiconductor device structure 200 may be or include a bulk semiconductor substrate, a semiconductor-on-insulator (SOI) substrate, or the like, which may be doped (e.g., with a p-type dopant or an n-type dopant) or undoped. In some embodiments, the semiconductor material of the body 210 may include an elemental semiconductor, for example, such as silicon (Si) or germanium (Ge); a compound semiconductor including, for example, silicon carbide, gallium arsenide, gallium phosphide, indium phosphide, indium arsenide, and/or indium antimonide; an alloy semiconductor including, for example, SiGe, GaAsP, AlInAs, GaInAs, GaInP, and/or GaInAsP; a combination thereof, or the like. The body 210 may include additional materials, for example, silicide layers, metal silicide layers, metal layers, dielectric layers, or a combination thereof.

The dielectric layer 220 may include multiple layers. The dielectric layer 220 includes a top surface 229. In some embodiments, the dielectric layer 220 is silicon oxide, silicon oxynitride, silicon nitride, or a combination thereof. In some embodiments, the dielectric layer 220 consists essentially of silicon oxide. It is noted that the foregoing descriptors (e.g., silicon oxide) should not be interpreted to disclose any particular stoichiometric ratio. Accordingly, "silicon oxide" and the like will be understood by one skilled in the art as a material consisting essentially of silicon and oxygen without disclosing any specific stoichiometric ratio.

The dielectric layer 220 is patterned with one or more feature(s) 222. In some embodiments, the feature 222 can be selected from a trench, a via, a hole, or combinations thereof. In particular embodiments, the feature 222 is a via.

At operation 320, a liner layer 225 is formed over the surfaces of the one or more features. A PVD process, an ALD process, an EPI process, or other suitable deposition process may form the liner layer 225. The liner layer 225 may be formed from a titanium silicon (nitride) or other suitable material. The liner layer 225 may be formed on exposed surfaces of the substrate. As shown in FIG. 2A, the liner layer 225 is disposed in the feature 222 and along the top surface 229 of the dielectric layer 220. The liner layer 225 may be disposed inside the feature 222 when the feature 222 is a trench structure. Alternately, the liner layer 225 may be optional when the feature 222 is a via. The liner layer 225 may be disposed on the top surface 229 of the dielectric layer 220 including an upper surface or field region 227. In discussions below, when the liner layer 225 is absent, the field region 227 corresponds to the top surface 229 of the dielectric layer 220.

The liner layer 225 may have an initial thickness in a range from about 0 Å to about 100 Å, for example, in a range from about 20 Å to about 50 Å. In some embodiments, the liner layer 225 may be discontinuous along for example, the sidewall surface 223 and/or the bottom surface 224 of the feature 222. Any suitable metal deposition process may be used to deposit the liner layer 225. In one example, a PVD process is used to deposit the liner layer 225.

The feature 222 has a first depth as measured from the field region 227 to the bottom surface 224 and a width defined between the two-sidewall surfaces 223. In some embodiments, the depth is in a range of about 2 nm to 200 nm, 3 nm to 200 nm, 5 nm to 100 nm, 2 nm to 100 nm, or 50 nm to 100 nm. In some embodiments, the width is in a range of about 2 nm to 100 nm, 4 nm to 20 nm, 10 nm to 50 nm, or 50 nm to 100 nm. In some embodiments, the feature 222 has an aspect ratio (depth/width) in a range of about 1 to 20, 1 to 4, 1 to 2, or 3 to 4.

In some embodiments, the feature 222 extends from the field region 227 downwards into the body 210. The feature 222 includes sidewall surface 223 and a bottom surface 224 extending between the sidewall surfaces 223. The sidewall surface 223 and the bottom surface 224 are formed from the exposed liner layer 225 when the liner is present and on the dielectric layer 220 when the liner layer 225 is absent. In some embodiments, the sidewall surfaces 223 are tapered.

At operation 330, a seed layer 230 is formed over the surfaces of the one or more features, for example, over the surfaces of the liner layer 225. FIG. 2B illustrates a cross-sectional view of the semiconductor device structure 200 during intermediate stages of manufacturing corresponding to operation 330, in accordance with some embodiments. The seed layer 230 may be formed on exposed surfaces of the substrate, i.e., over the sidewall surface 223 and the bottom surface 224 of the feature 222 and on the field region 227.

The seed layer 230 is a metal material suitable to function as a seed layer for subsequent deposition of a metal gap-fill material. The seed layer 230 may be a molybdenum (Mo) or molybdenum-containing layer, a tungsten (W) or tungsten-containing layer, or a ruthenium (Ru) or ruthenium-containing layer. In one example, seed layer 230 is a molybdenum (Mo) or molybdenum-containing layer. The seed layer 230 may be formed over the sidewall surface 223 and the bottom surface 224 of the one or more features 222 and on the field region 227. The seed layer 230 may be a conformal layer. Any suitable deposition process 232 may be used to deposit the seed layer 230. In one example, a physical vapor deposition (PVD) process is used to deposit the seed layer 230. Alternately, a low temperature and low-pressure CVD or ALD process may be used to form the seed layer 230. The seed layer 230 may be used to repair any damage or discontinuities in the liner layer. In one example, the deposition process 232 may be cycled and is repeated for 3 to 7 cycles or even as few as 1-2 cycles.

The seed layer 230 may create an overhang portion in the field region 227, which obstructs or blocks the top openings of the one or more features 222. The overhang portion reduces the width of the top opening from a first larger width to a second narrower width at the top of the feature 222.

At operation 340, the seed layer 230 is exposed to a gradient oxidation process. FIG. 2C illustrates a cross-sectional view of the semiconductor device structure 200 during intermediate stages of manufacturing corresponding to operation 340, in accordance with some embodiments. The gradient oxidation process oxidizes portions of the seed layer 230 to form an oxidized seed layer 240.

In some embodiments, the gradient oxidation process includes the use of an $O_2$ inductively coupled plasma (ICP) that includes a limited gas flow to create an oxygen starvation reaction mode on the exposed metal seed layer 230 (e.g., molybdenum-containing layer). The $O_2$ ICP provides a low power $O_2$ plasma 242 with a high ion/radical ratio, which enhances the field oxidation and deactivates the reactive species before reaching the molybdenum-containing seed layer 230 over the bottom surface 224. In this mode the field region 227 and the overhang portion 234 are oxidized, or more heavily oxidized, which allows for preferential etching of the oxidized regions of the oxidized seed layer 240 while maintaining the seed layer 230 along the bottom surface 224 of the feature 222. In one example, the oxidation of the seed layer 230 has a selectivity at the field region 227 that is seven times greater than the selectivity at the bottom surface 224. Thus, the oxidized seed layer 240 is preferentially formed at in the field region 227. In one example, the gradient oxidation of molybdenum-containing seed layer 230 results in the formation of the $MoO_x$ oxidized seed layer 240.

In some embodiments, the gradient oxidation process includes a reduction process followed by an oxidation process. In some embodiments, the gradient oxidation process includes the oxidation process without the reduction process. The reduction process includes exposing the substrate to a reducing gas, for example, hydrogen. The oxidation process includes exposing the substrate to an oxidizing gas, for example, oxygen. In some embodiments, during the reduction process, the processing region is maintained at a pressure of less than about 120 mTorr, such as in a range from about 50 mTorr to about 110 mTorr, in a range from about 60 mTorr to about 100 Torr, or for example, in a range from about 70 mTorr to about 90 mTorr. Exposing the semiconductor device structure 200 to the reducing gas includes flowing the reducing gas into the processing region at a flow rate of about 200 sccm or less, such as in a range from about 100 sccm to about 170 sccm, or in a range from about 120 sccm to about 80 sccm. Exposing the semiconductor device structure 200 to the reducing agent may further include flowing a carrier gas, for example, an inert gas such as argon into the processing region at a flow rate of about 300 sccm or less, such as in a range from about 100 sccm to about 200 sccm, or in a range from about 120 sccm to about 150 sccm. During the reduction process, the semiconductor device structure 200 may be maintained at a temperature of about 450 degrees Celsius or less, such as in a range from about 200 degrees Celsius to about 450 degrees Celsius, in a range from about 250 degrees Celsius to about 400 degrees Celsius, or for example, in a range from about 300 degrees Celsius to about 350 degrees Celsius. During the reduction process, ICP plasma power of 2000 Watts or less, such as in a range from about 500 Watts to 1500 Watts, or for example, in a range from about 850 Watts to about 1000 Watts is applied to maintain the plasma. The reduction process may be performed for a time period of 60 seconds or less, such as in a range from about 10 seconds to about 40 seconds, or for example, in a range from about 10 seconds to about 30 seconds.

In some embodiments, during the oxidation process, the processing region is maintained at a pressure of less than about 10 mTorr, such as in a range from about 1 mTorr to about 5 mTorr, or for example, in a range from about 1 mTorr to about 2 mTorr. Exposing the seed layer 230 to the oxidizing gas includes flowing the oxidizing gas into the processing region at a flow rate of about 20 sccm or less, such as in a range from about 1 sccm to about 10 sccm, or in a range from about 1 sccm to about 5 sccm. Exposing the seed layer 230 to the reducing agent may further include flowing a carrier gas, for example, an inert gas such as argon, neon or krypton into the processing region at a flow rate of about 100 sccm or less, such as in a range from about 50 sccm to about 100 sccm, or in a range from about 50 sccm to about 100 sccm. During the oxidation process, the semiconductor device structure 200 may be maintained a temperature of about 450 degrees Celsius or less, such as in a range from about 200 degrees Celsius to about 450 degrees Celsius, in a range from about 250 degrees Celsius to about 400 degrees Celsius, or for example, in a range from about 300 degrees Celsius to about 350 degrees Celsius. During the oxidation process, ICP plasma power of 300 Watts or less, such as in a range from about 100 Watts to 300 Watts, or for example, in a range from about 180 Watts to about 210 Watts. The oxidation process may be performed for a time period of 60 seconds or less, such as in a range from about 10 seconds to about 40 seconds, or for example, in a range from about 12 seconds to about 30 seconds.

In some embodiments, the oxidation process is performed at a pressure in a range from about 2 mTorr to about 7 mTorr, at an ICP power in a range from about 210 Watts to about 350 Watts, at a flow rate of argon gas into the processing region in a range from about 50 sccm to about 100 sccm, at a flow rate of oxygen gas into the processing region in a range from about 2 sccm to about 10 sccm, at a temperature in a range from about 300 degrees Celsius to about 400 degrees Celsius, and for a time period from about 90 seconds to about 180 seconds.

At operation 350, the oxidized seed layer 240 is exposed to an etch back process. FIG. 2D illustrates a cross-sectional view of the semiconductor device structure 200 during intermediate stages of manufacturing corresponding to operation 350, in accordance with some embodiments. The etch back process selectively targets the oxidized seed layer 240 over seed layer 230. That is, the lower etching rate for the metal molybdenum (the seed layer 230) over its oxide (the oxidized seed layer 240) results in the additional removal of the seed layer 230 in the field region 227 and sidewall 223 over the bottom surface 224.

The etch back process includes flowing an etching gas and optional inert gas into the processing region. The etching gas can include chlorine or fluorine containing gas, or a combination thereof, wherein the etchant is selected to be reactive to the metal oxide, i.e., the oxidized seed layer 240, over the non-oxide metal, i.e., the seed layer 230. In some embodiments, the etch back process is performed at a pressure in a range from about 5 mTorr to about 20 mTorr, at an ICP power in a range from about 300 Watts to about 400 Watts, at a flow rate of argon gas into the processing region in a range from about 450 sccm to about 500 sccm, at a flow rate of WF6 gas into the processing region in a range from about 5 sccm to about 10 sccm, at a temperature in a range from about 300 degrees Celsius to about 470 degrees Celsius, and for a time period from about 15 seconds to about 30 seconds. The oxidized seed layer 240 may optionally be thermally soaked in WF6 or Chlorine containing gases at high pressure of about 0.5 Torr to about 15.0 Torr.

The etch back process exposes the oxidized seed layer 240 to an etchant process to selectively remove the oxidized seed layer 240 with minimal removal of the underlying seed layer 230. The etch back process may be sufficient to reduce the thickness of the seed layer 230 from the initial thickness to a targeted reduced thickness in the field region 227 and in some example, completely remove the seed layer 230 from the sidewall, as shown in FIG. 2D. In one example, a bottom portion 235 of the seed layer 230 is maintained thicker than a field portion 233 of the seed layer 230. Thus, the seed layer 230 in the field region 227 is thinner than the seed layer 230 formed over the bottom surface 224. That is, the remaining thickness of the molybdenum-containing seed layer 230 formed over the field region 227 is reduced greater than a thickness of the molybdenum-containing seed layer 230 formed over the bottom surface 224 of the feature 222.

At operation 360, the one or more features are isotopically etched. FIG. 2E illustrates a cross-sectional view of the semiconductor device structure 200 during intermediate stages of manufacturing corresponding to operation 360, in accordance with some embodiments. The isotropic etch back process removes the remaining seed layer 230 in both the field region 227 and along the bottom surface 224 of the feature 222 at a similar rate. However, due to the increased thickness of the seed layer 230 along the bottom surface 224 compared to the field region 277, the isotropic etch results in leaving only the material of the seed layer 230 along the bottom surface 224 of the feature 222. The removal of the seed layer 230 from all surfaces except the bottom surface 224 improves film quality during a subsequent metal bottom up fill. The seed layer 230 removal from the sidewall surface 223 and field region 227 substantially inhibits the formation of seams and voids, present during conventional processing, during the subsequent metal gap-fill. Maintaining the seed layer 230 exclusively along the bottom surface 224 of the feature 222 for the metal gap bottom up fill, substantially results in seam-free metal gap-fill.

At operation 370, the one or more features are filled with a metal material. FIG. 2F illustrates a cross-sectional view of the semiconductor device structure 200 during intermediate stages of manufacturing corresponding to operation 360, in accordance with some embodiments. A metal may be formed on the seed layer 230 to fill the feature 222 to form a gap-fill layer 250. Any suitable metal deposition process may be used to deposit the gap-fill layer 250. The gap-fill layer 250 may be deposited via a chemical vapor deposition (CVD) gap-fill process. The gap-fill layer 250 may partially or completely fill the one or more features. The gap-fill layer 250 is formed from a metal such as tungsten (W), molybdenum (Mo), or ruthenium (Ru), among others. In one example, the gap-fill layer 250 is formed of molybdenum (Mo).

In some embodiments, the gap-fill layer 250 is formed using a chemical vapor deposition (CVD) process comprising concurrently flowing (co-flowing) a molybdenum-containing precursor gas, and a reducing agent, into the processing region and exposing the semiconductor device structure 200 thereto.

In another embodiment, the gap-fill layer 250 is deposited at operation 360 using an atomic layer deposition (ALD) process. The molybdenum gap-fill ALD process includes repeating cycles of alternately exposing the semiconductor device structure 200 to a molybdenum-containing precursor gas and a reducing agent and purging the processing region between the alternating exposures.

In other embodiments, the gap-fill layer 250 is deposited using a pulsed CVD method that includes repeating cycles of alternately exposing the semiconductor device structure 200 to a molybdenum-containing precursor gas and a reducing gas without purging the processing region.

The previously described embodiments of the present disclosure have many advantages, including the metal oxidation process and selective metal oxide removal process can be completed in two process chambers or in a single process chamber, thus reducing fabrication times and the potential for handling induced defects. The method utilizes an inductively coupled plasma (ICP) $O_2$ plasma that includes a diffusion limited gas flow within features (e.g., trenches or vias) formed on a substrate to create an oxygen-starved reaction. In one embodiment, the use of an ICP $O_2$ plasma, a low weak energy $O_2$ plasma with high ion/radical ratio, is created to enhance the field oxidation and deplete the reactive oxygen species before reaching the bottom of a trench structure or gap. This gives good selectivity (>7) in the trench structure and top-field metal is thinned compared to the seed material remaining in the bottom of a trench structure or gap. A second isotropic etch operation is performed targeting the metal seed material directly. The top-field metal material is removed completely prior to the bottom of the trench due to the material being thinner, i.e., less material, in the top-field are. This leaves seed material only in the bottom of the trench for a bottom-up growth metal fill. The methods enables high wafer throughput with less cycling. The methods addresses the challenges of seam and voids during conventional metal gap fill by removing metal from the field region and the sidewall, while maintaining the seeding metal at the bottom of the gap or trenches. In this manner, a substantially seam-free bottom up metal gap fill can be performed.

While the foregoing is directed to embodiments of the present disclosure, other and further embodiments of the disclosure may be devised without departing from the basic scope thereof, and the scope thereof is determined by the claims that follow.

The invention claimed is:

1. A method of filling a feature on a substrate, the method comprising:

forming a metal seed layer on exposed top surface of the substrate, wherein the substrate has features in the form of trenches or vias formed in the top surface of the substrate, the features having sidewalls and a bottom surface extending between the sidewalls;

performing a gradient oxidation process to oxidize exposed portions of the metal seed layer to form a metal oxide, wherein the gradient oxidation process preferentially oxidizes a field region of the substrate over the bottom surface of the features, performing an etch back process to remove the oxidized portion of the seed layer;

performing an isotropic etch process to remove portions of the seed layer, wherein the isotropic etch process removes the seed layer from all surfaces except the bottom surface of the features; and performing a metal gap-fill process to fill or partially fill the features with a gap fill material.

2. The method of claim 1, wherein the seed layer is a molybdenum-containing layer, the metal oxide is molybdenum oxide, and the metal gap fill material contains molybdenum.

3. The method of claim 2, wherein an overhang portion of the seed layer extends into an opening of one or more features formed along the field region of the substrate, and the overhang portion is preferentially oxidized relative to the metal seed layer within the one or more features.

4. The method of claim 2, wherein the gradient oxidation process and the etch back process are performed in two separate chambers.

5. The method of claim 2, further comprising:

forming a liner layer on the top surface of the substrate, wherein the seed layer is formed on the liner layer and the liner layer extends into the features.

6. The method of claim 3, wherein the etch back process and the isotropic etch process are performed in the same chamber.

7. The method of claim 3, wherein the seed layer is removed from the field region and the overhang portion.

8. A method of filling a feature formed on a substrate, the method comprising:

depositing a molybdenum-containing layer over exposed top surface of a substrate, wherein the substrate comprises a plurality of features formed in the top surface of the substrate, each of the plurality of features has a sidewall surface and a bottom surface, and the deposited molybdenum-containing layer is formed over the top surface of the substrate, and the sidewall surface and the bottom surface of the plurality of features;

exposing the top surface of the substrate to a gradient oxidizing process, wherein the gradient oxidizing process forms oxidized regions of the molybdenum-containing layer;

preferentially etching the oxidized regions of the deposited molybdenum-containing layer, wherein after preferentially etching the oxidized regions, a first portion of the deposited molybdenum-containing layer remains on the bottom surface and in the top surface around each of the plurality of features;

performing an isotropic etch process to remove the molybdenum-containing layer along the top surface while maintaining the molybdenum-containing layer on the bottom surface in each of the plurality of features, wherein the isotropic etch process removes the seed layer from all surfaces except the bottom surface of the features; and filling the features with a second molybdenum layer, wherein filling the features with the second molybdenum layer comprises growing the second molybdenum layer from the first portion of the deposited molybdenum-containing layer on the bottom surface in each of the features.

9. The method of claim 8, wherein an overhang portion of the molybdenum-containing layer extends into an opening of one or more features formed along the top surface of the substrate, and the overhang portion is preferentially oxidized relative to the molybdenum-containing layer within the one or more features.

10. The method of claim 8, wherein the gradient oxidation process and the etch back process are performed in two separate chambers.

11. The method of claim 8, further comprising:

forming a liner layer on the top surface of the substrate, wherein the molybdenum-containing layer is formed on the liner layer and the liner layer extends into the features.

12. The method of claim 9, wherein the etch back process and the isotropic etch process are performed in the same chamber.

13. The method of claim 12, wherein the molybdenum-containing layer is removed from the top surface and the overhang portion.

* * * * *